United States Patent
Kim

(10) Patent No.: US 12,249,384 B2
(45) Date of Patent: Mar. 11, 2025

(54) MEMORY REPAIR CIRCUIT, A MEMORY REPAIR METHOD, AND A MEMORY DEVICE

(71) Applicant: SAMSUNG ELECTRONICS CO., LTD., Suwon-si (KR)

(72) Inventor: Hyunseok Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 1 day.

(21) Appl. No.: 18/368,086

(22) Filed: Sep. 14, 2023

(65) Prior Publication Data
US 2024/0265987 A1    Aug. 8, 2024

(30) Foreign Application Priority Data

Feb. 3, 2023    (KR) .................... 10-2023-0015034

(51) Int. Cl.
*G06F 12/00* (2006.01)
*G06F 3/06* (2006.01)
*G11C 29/12* (2006.01)

(52) U.S. Cl.
CPC ............ *G11C 29/12* (2013.01); *G06F 3/0614* (2013.01); *G06F 3/0653* (2013.01); *G06F 3/0673* (2013.01)

(58) Field of Classification Search
CPC . G11C 29/12; G11C 2029/4402; G11C 29/20; G11C 29/42; G11C 29/4401; G11C 29/72; G11C 29/76; G11C 29/88; G11C 29/808; G06F 3/0614; G06F 3/0653; G06F 3/0673
See application file for complete search history.

(56) References Cited

U.S. PATENT DOCUMENTS

| | | | |
|---|---|---|---|
| 7,706,198 B2 | 4/2010 | Jeong et al. | |
| 8,760,949 B2 | 6/2014 | Shvydun et al. | |
| 10,446,253 B2 | 10/2019 | Choi | |
| 10,861,577 B2 | 12/2020 | Woo | |
| 2008/0148114 A1* | 6/2008 | Barth | G11C 29/44 714/E11.169 |
| 2012/0036404 A1* | 2/2012 | Tabata | G11C 29/56008 714/E11.147 |
| 2015/0155055 A1* | 6/2015 | Kim | G11C 17/16 365/96 |

(Continued)

FOREIGN PATENT DOCUMENTS

| | | | | |
|---|---|---|---|---|
| CN | 115394344 A | * | 11/2022 | ......... G11C 29/4401 |
| KR | 10-2400631 | | 5/2022 | |

*Primary Examiner* — Shawn X Gu
*Assistant Examiner* — Mohammad S Hasan
(74) *Attorney, Agent, or Firm* — F. CHAU & ASSOCIATES, LLC

(57) ABSTRACT

A memory repair circuit of a memory module including a plurality of memory packages, the memory repair circuit including: a test circuit configured to test the plurality of memory packages to obtain fail information in each of the plurality of memory packages; and a redundancy analysis circuit configured to: obtain a redundant address count in each of the plurality of memory packages, determine a repair order of the plurality of memory packages based on the fail information and the redundant address count, and perform a virtual repair on the plurality of memory packages in the repair order to determine an address to be repaired in each of the plurality of memory packages.

20 Claims, 21 Drawing Sheets

(56) References Cited

U.S. PATENT DOCUMENTS

| | | | |
|---|---|---|---|
| 2017/0262337 A1 | 9/2017 | Chang et al. | |
| 2020/0321071 A1* | 10/2020 | Varadarajan | G11C 17/16 |
| 2021/0375379 A1* | 12/2021 | Lim | G11C 29/4401 |
| 2023/0178171 A1* | 6/2023 | Kim | G11C 29/54 |
| | | | 365/200 |

* cited by examiner

FIG. 9

| REDUNDANT ADDRESS COUNT | PKG0 | PKG1 | PKG2 | PKG3 | PKG4 | ... | PKG14 | PKG15 | PKG16 | PKG17 | TOTAL ERROR |
|---|---|---|---|---|---|---|---|---|---|---|---|
| ADDR0 | 10 | 5 | 10 | 10 | 10 | ... | 10 | 6 | 4 | 2 | |
| ADDR1 | 0 | 1 | 1 | 0 | 0 | ... | 1 | 0 | 0 | 1 | 4 |
| ADDR2 | 0 | 3 | 0 | 1 | 4 | ... | 0 | 0 | 0 | 0 | 8 |
| ADDR3 | 2 | 0 | 0 | 0 | 0 | ... | 0 | 2 | 2 | 2 | 8 |
| ADDR5 | 1 | 1 | 1 | 1 | 1 | ... | 1 | 1 | 1 | 1 | 9 |
| TOTAL FAIL BITS | 1 | 0 | 3 | 0 | 0 | ... | 0 | 0 | 0 | 2 | 6 |
| LIST VALUE | 4 | 5 | 5 | 2 | 5 | ... | 2 | 3 | 3 | 6 | |
| | 6 | 0 | 5 | 8 | 5 | ... | 8 | 3 | 1 | -4 | |

FIG. 10

| REDUNDANT ADDRESS COUNT | PKG3 | PKG14 | PKG0 | PKG2 | PKG4 | ... | PKG15 | PKG16 | PKG1 | PKG17 | TOTAL ERROR |
|---|---|---|---|---|---|---|---|---|---|---|---|
| COUNT | 10 | 10 | 10 | 10 | 10 | ... | 6 | 4 | 5 | 2 | |
| ADDR0 | 0 | 1 | 0 | 1 | 0 | ... | 0 | 0 | 1 | -1 | 4 |
| ADDR1 | 1 | 0 | 2 | 0 | 4 | ... | 0 | 2 | 3 | 0 | 8 |
| ADDR2 | 0 | 0 | -1 | -1 | 0 | ... | 2 | -1 | 0 | 2 | 8 |
| ADDR3 | 1 | -1 | -1 | -1 | -1 | ... | -1 | 0 | -1 | -1 | 9 |
| ADDR5 | 0 | 0 | 4 | 3 | 0 | ... | 0 | 3 | 0 | 2 | 6 |
| TOTAL FAIL BITS | 2 | 2 | 6 | 5 | 5 | ... | 3 | 3 | 5 | 6 | |
| LIST VALUE | 8 | 8 | | | 3 | ... | 3 | 1 | 0 | -4 | |

FIG. 12

| REDUNDANT ADDRESS | PKG3 | PKG14 | PKG0 | PKG2 | PKG4 | ... | PKG15 | PKG16 | PKG1 | PKG17 | FIRST LOCK |
|---|---|---|---|---|---|---|---|---|---|---|---|
| COUNT | 8 | 8 | 10 | 10 | 10 | ... | 6 | 4 | 5 | 2 | 3 |
| ADDR0 | 0 | 0 | 0 | 1 | 0 | ... | 0 | 0 | 1 | 1 | 7 |
| ADDR1 | 0 | 0 | 2 | 0 | 4 | ... | 0 | 2 | 3 | 0 | 8 |
| ADDR2 | 0 | 0 | 1 | 1 | 0 | ... | 2 | 1 | 0 | 2 | 7 |
| ADDR3 | 0 | 0 | 1 | 1 | 1 | ... | 1 | 0 | 1 | 1 | 6 |
| ADDR5 | 0 | 0 | 4 | 3 | 0 | ... | 3 | 3 | 5 | 2 | |
| TOTAL FAIL BITS | 8 | 8 | 6 | 5 | 5 | ... | 3 | 1 | 5 | 6 | |
| LIST VALUE | | | | 5 | 5 | ... | 3 | | 0 | -4 | |

FIG. 13

| | PKG3 | PKG14 | PKG0 | PKG2 | PKG4 | ... | PKG15 | PKG16 | PKG1 | PKG17 | SECOND LOCK |
|---|---|---|---|---|---|---|---|---|---|---|---|
| REDUNDANT ADDRESS COUNT | 8 | 8 | 6 | 7 | 5 | | 6 | 4 | 5 | 2 | |
| ADDR0 | 0 | 0 | 0 | 1 | 0 | | 0 | 0 | 1 | -1 | 3 |
| ADDR1 | 0 | 0 | 0 | 0 | 0 | | 0 | 2 | 3 | 0 | 3 |
| ADDR2 | 0 | 0 | 0 | 0 | 0 | | 2 | 1 | 0 | 2 | 6 |
| ADDR3 | 0 | 0 | 0 | 0 | 0 | | -1 | 0 | -1 | -1 | 4 |
| ADDR5 | 0 | 0 | 0 | 1 | 0 | | 0 | 3 | 0 | 2 | 2 |
| TOTAL FAIL BITS | 8 | 8 | 6 | 5 | 5 | | 3 | 1 | 5 | 6 | |
| LIST VALUE | | | | | | | 3 | | 0 | -4 | |

FIG. 14

| | PKG3 | PKG14 | PKG0 | PKG2 | PKG4 | ... | PKG15 | PKG16 | PKG1 | PKG17 | THIRD LOCK |
|---|---|---|---|---|---|---|---|---|---|---|---|
| REDUNDANT ADDRESS COUNT | 8 | 8 | 6 | 7 | 5 | ... | 3 | 4 | 5 | 2 | |
| ADDR0 | 0 | 0 | 0 | 1 | 0 | ... | 0 | 0 | 1 | 1 | |
| ADDR1 | 0 | 0 | 0 | 0 | 0 | ... | 0 | 2 | 3 | 0 | -4 |
| ADDR2 | 0 | 0 | 0 | 0 | 0 | ... | 0 | 1 | 0 | 2 | |
| ADDR3 | 0 | 0 | 0 | 0 | 0 | ... | 0 | 0 | 1 | 1 | |
| ADDR5 | 0 | 0 | 6 | 1 | 0 | ... | 3 | 3 | 5 | 2 | -2 |
| TOTAL FAIL BITS | 8 | 8 | 6 | 5 | 5 | ... | 3 | 1 | 5 | 6 | |
| LIST VALUE | | | | | | ... | | | 0 | -4 | |

FIG. 15

| REDUNDANT ADDRESS COUNT | PKG3 | PKG14 | PKG0 | PKG2 | PKG4 | ... | PKG15 | PKG16 | PKG1 | PKG17 | FOURTH LOCK | REPAIR |
|---|---|---|---|---|---|---|---|---|---|---|---|---|
|  | 8 | 8 | 6 | 7 | 5 | ... | 3 | 2 | 5 | 2 |  |  |
| ADDR0 | 0 | 0 | 0 | 1 | 0 | ... | 0 | 0 | 1 | 2 | 3 | PKG14 |
| ADDR1 | 0 | 0 | 0 | 0 | 0 | ... | 0 | 0 | 3 | 0 | 3 | PKG3, PKG4 |
| ADDR2 | 0 | 0 | 0 | 0 | 0 | ... | 0 | 0 | 0 | 2 | 4 | PKG0, PKG15, PKG16 |
| ADDR3 | 0 | 0 | 0 | 0 | 0 | ... | 0 | 1 | 1 | 1 | 3 | PKG0, PKG2, PKG3, PKG4, PKG14, PKG15 |
| ADDR5 | 0 | 0 | 0 | 0 | 0 | ... | 0 | 0 | 0 | 2 | 2 | PKG0, PKG2 |
| TOTAL FAIL BITS | 0 | 0 | 0 | 1 | 0 | ... | 0 | 1 | 5 | 6 |  |  |
| LIST VALUE | 8 | 8 | 6 | 5 | 5 | ... | 3 | 1 | 0 | -4 |  |  |

FIG. 17

| REDUNDANT ADDRESS COUNT | PKG0 | PKG1 | PKG2 | PKG3 | PKG4 | ... | PKG14 | PKG15 | PKG16 | PKG17 | TOTAL ERROR |
|---|---|---|---|---|---|---|---|---|---|---|---|
|  | 10 | 5 | 10 | 10 | 10 | ... | 10 | 6 | 4 | 2 |  |
| ADDR0 | 0 | 1 | 1 | 0 | 0 | ... | 1 | 0 | 0 | 1 | 4 |
| ADDR1 | 0 | 3 | 0 | 1 | 4 | ... | 0 | 0 | 0 | 0 | 8 |
| ADDR2 | 2 | 0 | 0 | 0 | 0 | ... | 0 | 2 | 2 | 2 | 8 |
| ADDR3 | 1 | 1 | 1 | 1 | 1 | ... | 1 | 1 | 1 | 1 | 9 |
| ADDR5 | 0 | 0 | 3 | 0 | 0 | ... | 0 | 0 | 0 | 2 | 6 |
| FAIL ADDRESS COUNT | 3 | 3 | 3 | 2 | 2 | ... | 2 | 2 | 2 | 4 |  |
| LIST VALUE | 7 | 2 | 7 | 8 | 8 | ... | 8 | 4 | 2 | -2 |  |

FIG. 18

| | PKG3 | PKG4 | PKG14 | PKG0 | PKG2 | ... | PKG15 | PKG1 | PKG16 | PKG17 | TOTAL ERROR |
|---|---|---|---|---|---|---|---|---|---|---|---|
| REDUNDANT ADDRESS COUNT | 10 | 10 | 10 | 10 | 10 | | 6 | 5 | 4 | 2 | |
| ADDR0 | 0 | 0 | 1 | 0 | 1 | | 0 | 1 | 0 | 1 | 4 |
| ADDR1 | 1 | 4 | 0 | 0 | 0 | | 0 | 3 | 0 | 0 | 8 |
| ADDR2 | 0 | 0 | 0 | 2 | 0 | | 2 | 0 | 2 | 2 | 8 |
| ADDR3 | 1 | 1 | 1 | 1 | 1 | | 1 | 1 | 1 | 1 | 9 |
| ADDR5 | 0 | 0 | 0 | 1 | 3 | | 0 | 0 | 0 | 2 | 6 |
| FAIL ADDRESS COUNT | 2 | 2 | 2 | 3 | 3 | | 2 | 3 | 2 | 4 | |
| LIST VALUE | 8 | 8 | 8 | 7 | 7 | | 4 | 2 | 2 | -2 | |

FIG. 20

| REDUNDANT ADDRESS COUNT | PKG3 | PKG4 | PKG14 | PKG0 | PKG2 | ... | PKG15 | PKG1 | PKG16 | PKG17 | LOCK | REPAIR |
|---|---|---|---|---|---|---|---|---|---|---|---|---|
|  | 8 | 10 | 10 | 10 | 10 | ... | 6 | 5 | 4 | 2 |  |  |
| ADDR0 | 0 | 0 | 0 | 0 | 1 | ... | 0 | 1 | 0 | 1 | 3 | PKG14 |
| ADDR1 | 0 | 0 | 0 | 0 | 0 | ... | 0 | 3 | 0 | 0 | 3 | PKG3, PKG4 |
| ADDR2 | 0 | 0 | 0 | 0 | 0 | ... | 0 | 0 | 0 | 2 | 2 | PKG0, PKG15, PKG16 |
| ADDR3 | 0 | 0 | 0 | 0 | 0 | ... | 0 | 1 | 1 | 1 |  |  |
| ADDR6 | 0 | 0 | 0 | 0 | 0 | ... | 0 | 0 | 0 | 2 | 3 | PKG0, PKG3, PKG4, PKG14, PKG15 |
| FAIL ADDRESS COUNT | 0 | 0 | 0 | 0 | 1 | ... | 0 | 3 | 1 | 4 | 2 | PKG0, PKG2 |
| LIST VALUE | 8 | 8 | 8 | 7 | 7 | ... | 4 | 2 | 2 | -2 |  |  |

MEMORY REPAIR CIRCUIT, A MEMORY REPAIR METHOD, AND A MEMORY DEVICE

CROSS-REFERENCE TO RELATED APPLICATION

This application claims priority under 35 U.S.C. § 119 to Korean Patent Application No. 10-2023-0015034 filed in the Korean Intellectual Property Office on Feb. 3, 2023, the disclosure of which is incorporated by reference herein in its entirety.

(a) TECHNICAL FIELD

The present disclosure relates to a memory repair circuit, a memory repair method, and a memory device.

(b) DESCRIPTION OF THE RELATED ART

A memory device may include redundant memory cells, which serve as backup cells for replacing fail memory cells. When a memory cell is identified as fail, a repair operation referred to as post package repair (PPR) may be performed. This operation involves replacing the memory address associated with the failed memory cell with a redundant address that corresponds to one of the redundant memory cells.

The memory device may use an error correction code (ECC) scheme to ensure a required level of reliability. If the ECC scheme can cover fail bits caused by fail memory cells, the fail bits in some of the fail memory cells may be corrected by using the ECC scheme, thereby eliminating the need to repair all the fail memory cells. Thus, a memory repair method that takes an ECC scheme into account may be necessary.

SUMMARY

Some embodiments of the present disclosure may provide a memory repair circuit, a memory repair method, and a memory device for repairing a fail memory cell by using an error correction code (ECC) scheme.

According to an embodiment of the present disclosure, there is provided a memory repair circuit of a memory module including a plurality of memory packages, the memory repair circuit including: a test circuit configured to test the plurality of memory packages to obtain fail information in each of the plurality of memory packages; and a redundancy analysis circuit configured to: obtain a redundant address count in each of the plurality of memory packages, determine a repair order of the plurality of memory packages based on the fail information and the redundant address count, the fail information including a first fail address in each of the plurality of memory packages and a fail bit count in the first fail address, and perform a virtual repair on the plurality of memory packages in the repair order to determine a second fail address to be repaired in each of the plurality of memory packages.

According to an embodiment of the present disclosure, there is provided a memory device including: a plurality of memory packages; and a controller configured to: determine a repair order of the plurality of memory packages based on fail information in each of the plurality of memory packages and a redundant address count in each of the plurality of memory packages, the fail information including a first fail address and a fail bit count in the first fail address, and determine a second address to be repaired in each of the plurality of memory packages in the repair order.

According to an embodiment of the present disclosure, there is provided a method of repairing a memory module including a plurality of memory packages, the method including: obtaining fail information in each of the plurality of memory packages; obtaining a redundant address count in each of the plurality of memory packages; determining a repair order of the plurality of memory packages based on the fail information and the redundant address count; and determining an address to be repaired in each of the plurality of memory packages in the repair order.

BRIEF DESCRIPTION OF THE DRAWINGS

FIG. 9 is a diagram illustrating an example of a list generated by a memory repair circuit.

FIG. 10 is a diagram illustrating an example of a list sorted by a memory repair circuit.

FIG. 12, FIG. 13, FIG. 14, and FIG. 15 each are a drawing illustrating an example of an address that is locked based on a virtual repair in a memory repair circuit.

FIG. 17 is a diagram illustrating an example of a list generated by a memory repair circuit.

FIG. 18 is a diagram illustrating an example of a list sorted by a memory repair circuit.

FIG. 20 is a diagram illustrating an example of an address that is locked based on a virtual repair in a memory repair circuit.

DETAILED DESCRIPTION OF THE EMBODIMENTS

Figure 1:
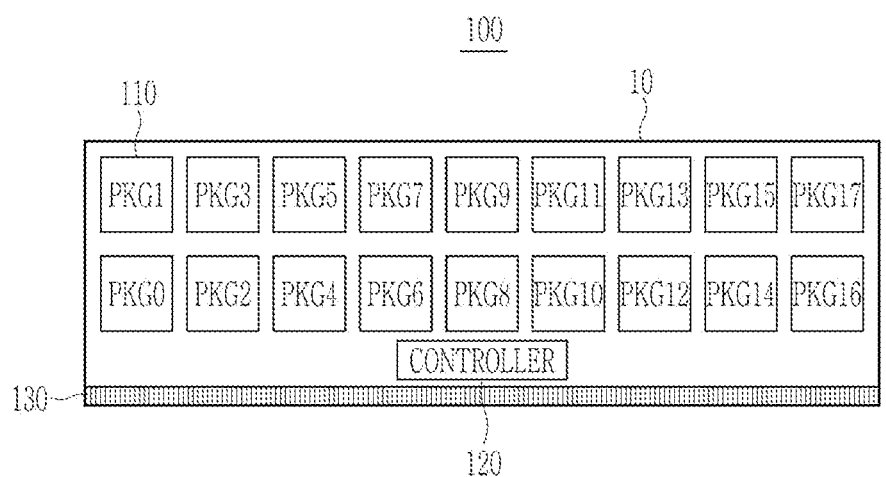
FIG. 1 is a block diagram illustrating an example of a memory device according to some embodiments of the present disclosure.

In the following detailed description, certain embodiments of the present invention are shown and described. As those skilled in the art would realize, the described embodiments may be modified in various ways, without departing from the scope of the present invention.

Accordingly, the drawings and description are to be regarded as illustrative in nature and not restrictive. Like reference numerals may designate like elements throughout the specification. The sequence of operations or steps is not limited to the order presented in the claims or figures unless specifically indicated otherwise. For example, the order of operations or steps may be changed, several operations or steps may be merged, a certain operation or step may be divided, and a specific operation or step may not be performed.

As used herein, the singular forms "a" and "an" are intended to include the plural forms as well, unless the context clearly indicates otherwise. Although the terms first, second, and the like may be used herein to describe various elements, components, steps and/or operations, these terms are simply used to distinguish one element, component, step or operation from another element, component, step, or operation.

Figure 2:
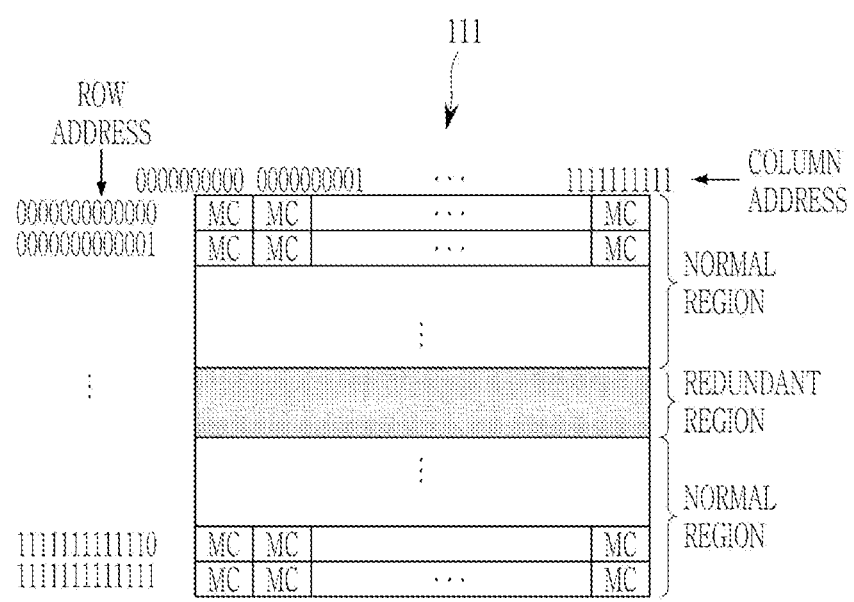
FIG. 2 is a diagram illustrating an example of memory cell addresses in a memory package according to some embodiments of the present disclosure.
Figure 3:
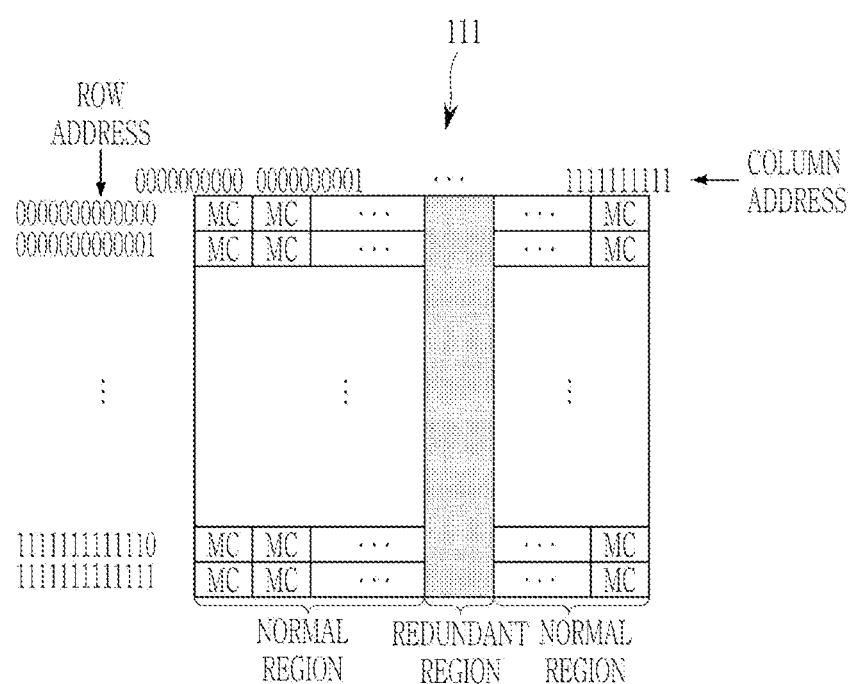
FIG. 3 is a diagram illustrating another example of memory cell addresses in a memory package according to some embodiments of the present disclosure.

FIG. 1 is a block diagram illustrating an example of a memory device according to some embodiments of the present disclosure, and FIG. 2 and FIG. 3 each are a diagram illustrating an example of memory cell addresses in a memory package according to some embodiments of the present disclosure.

Referring to FIG. 1, a memory device 100 may include a plurality of memory packages 110 and a controller 120, and the memory packages 110 and controller 120 may be mounted on a substrate 10. In some embodiments, the memory device 100 may be a memory module which may be, for example, a dual in-line memory module (DIMM). Although eighteen memory packages 110 are shown in FIG. 1, the number of memory packages 110 is not limited thereto. Further, the memory packages 110 are denoted as PKG0, PKG1 . . . PKG17, respectively.

The memory package 110 may be a memory based on a semiconductor device. In some embodiments, the memory package 110 may be a memory chip which may include, for example, one or more memory dies. In some embodiments, the memory package 110 may include, for example, a dynamic random-access memory (DRAM) package, but is not limited thereto. In some embodiments, some memory packages (e.g., PKG16 and PKG17) among the plurality of memory packages 110 may be used as error correction code (ECC) memory packages. The ECC memory packages PKG16 and PKG17 may store bits that are generated by ECC encoding.

Referring to FIGS. 2 and 3, the memory package 110 may include a memory cell array 111. The memory cell array 111 may include a plurality of memory cells MC arranged in substantially a matrix. The memory cell array 111 may further include a plurality of wordlines extending in substantially a row direction and a plurality of bitlines extending in substantially a column direction, and the plurality of memory cells MC may be disposed at intersections of the plurality of wordlines and the plurality of bitlines.

In the memory cell array 111, each row (e.g., the plurality of memory cells MCs arranged in each row) may be assigned a row address, and each column (e.g., the plurality of memory cells MCs arranged in each column) may be assigned a column address. Although FIGS. 2 and 3 show examples in which the first row to the last row are assigned "0000000000000" to "1111111111111" and the first column to the last column are assigned "0000000000" to "1111111111", the examples are not limited thereto.

In some embodiments, as shown in FIG. 2, the memory cell array 111 may be divided into a normal region and a redundant region in the column direction. The redundant region may include redundant row addresses as redundant addresses. For example, a region corresponding to a predetermined number of rows in the memory cell array 111 may be set as the redundant region, and remaining regions may be set as the normal regions. A plurality of memory cells MCs formed in the normal regions may be used to store data. A plurality of memory cells MCs formed in the redundant region may be redundant memory cells MC which are used to repair fail memory cells MCs that have failed in the normal regions. In some embodiments, a row including the fail memory cell MC may be repaired (e.g., replaced) by a row of the redundant region. For example, a row address corresponding to the fail memory cell MC may be replaced with a row address (e.g., redundant address) in the redundant region. Although FIG. 2 shows that the redundant region is formed in the middle of the memory cell array 111 in the column direction, a location of the redundant region is not limited thereto. For example, the redundant region may be formed at the end of the memory cell array 111 in the column direction.

In some embodiments, as shown in FIG. 3, the memory cell array 111 may be divided into a normal region and a redundant region in the row direction. The redundant region may include redundant column addresses as redundant addresses. For example, a region corresponding to a predetermined number of columns in the memory cell array 111 may be set as the redundant region, and remaining regions may be set as the normal regions. A plurality of memory cells MC formed in the normal regions may be used to store data. A plurality of memory cells MC formed in the redundant region may be redundant memory cells MC that are used to repair fail memory cells MC that have failed in the normal region. In some embodiments, a column including the fail memory cell MC may be repaired (e.g., replaced) by a column of the redundant region. For example, a column address corresponding to the fail memory cell MC may be replaced with a column address (e.g., redundant address) in the redundant region. Although FIG. 3 shows that the redundant region is formed in the middle of the memory cell array 111 in the row direction, a location of the redundant region is not limited thereto. For example, the redundant region may be formed at the end of the memory cell array 111 in the row direction.

In some embodiments, the memory cell array 111 may include both the redundant region (e.g., redundant row addresses) divided in the column direction and the redundant region (e.g., redundant column addresses) divided in the row direction.

Referring to FIG. 1 again, the controller 120 may transfer a command and an address to the memory package 110. The controller 120 may test the memory package 110 to obtain fail information of the memory package 110, and may repair an address of a fail memory cell in the memory package 110 based on the fail information of the memory package 110 and redundant addresses remaining in the redundant region of the memory package 110. The controller 120 may determine a repair order of the memory packages 110 based on the fail information of the memory packages 110 and the remaining redundant addresses in the memory packages 110, and may virtually repair the memory packages 110 in the repair order to determine addresses to be repaired in the memory packages 110. In some embodiments, the controller 120 may perform error correction code (ECC) encoding and decoding. The controller 120 may perform the ECC encoding on data to be stored in the memory package 110 to generate parity bits, and perform the ECC decoding on data read from the memory package 110 to restore original data.

In some embodiments, the memory device 100 may further include an input/output (I/O) pad 130. The I/O pad 130 may be formed on a side of the substrate 10 and connected to a host. The I/O pad 130 may be connected to I/O paths of the memory packages 110 and the controller 120, and may include command/address signal input pins, clock input pins, and data I/O signal pins.

Figure 4:
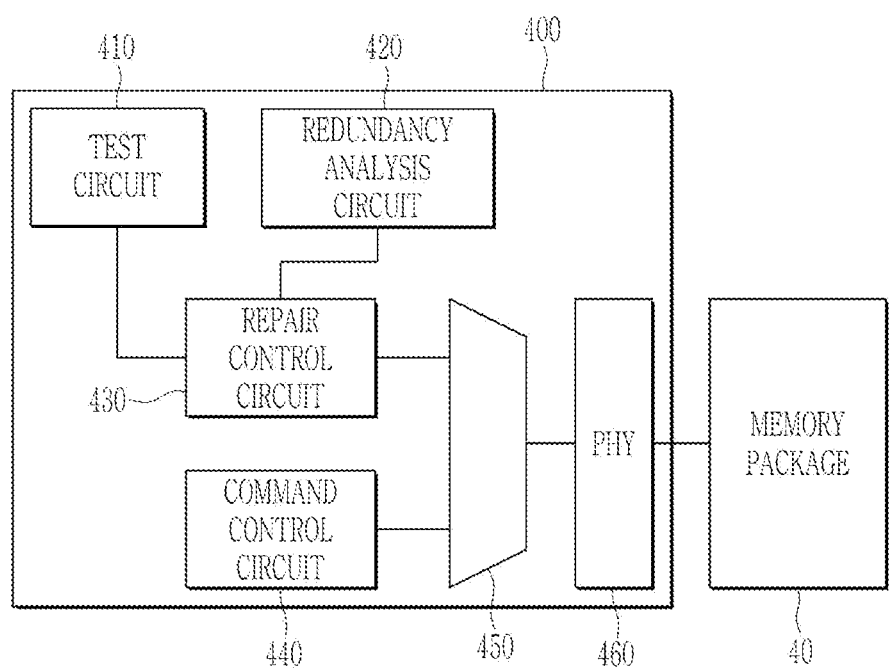
FIG. 4 is a block diagram illustrating an example of a memory repair circuit according to some embodiments of the present disclosure.
Figure 5:
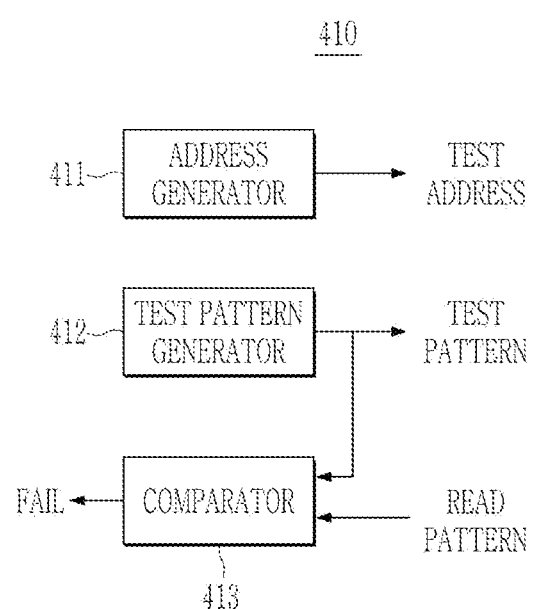
FIG. 5 is a block diagram illustrating an example of a test circuit shown in FIG. 4.
Figure 6:
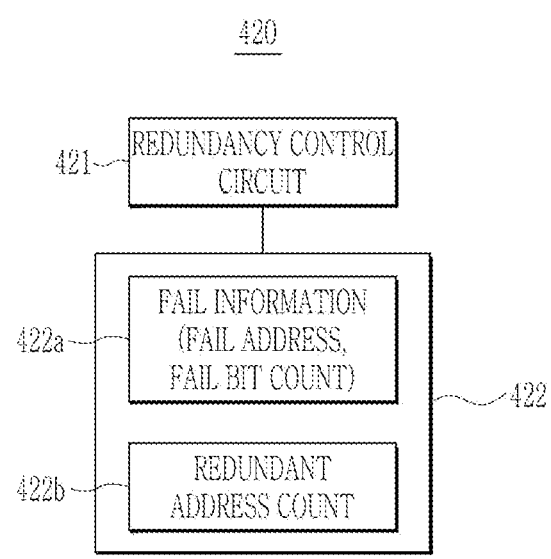
FIG. 6 is a block diagram illustrating an example of a redundancy analysis circuit shown in FIG. 4.

FIG. 4 is a block diagram illustrating an example of a memory repair circuit according to some embodiments of the present disclosure, FIG. 5 is a block diagram illustrating an example of a test circuit shown in FIG. 4, and FIG. 6 is a block diagram illustrating an example of a redundancy analysis circuit shown in FIG. 4.

Referring to FIG. 4, a memory repair circuit 400 may include a test circuit 410 and a redundancy analysis circuit 420.

The test circuit 410 may generate a test pattern for testing a plurality of memory packages 40, and may provide the test pattern to the plurality of memory packages 40 to obtain fail information of each memory package 40. In some embodiments, the fail information may include a fail address in the memory package 40 and a fail bit count (FBC) in the fail address. In some embodiments, the fail information may further include a fail address count in the memory package 40. The fail bit count may indicate the number of fail bits. The fail address may include a fail row address and/or a fail column address. The fail address count may indicate the number of fail addresses. In some embodiments, the test circuit 410 may be a built-in self-test (BIST) circuit.

In some embodiments, as shown in FIG. 5, the test circuit 410 may include an address generator 411, a test pattern generator 412, and a comparator 413.

The test pattern generator 412 may generate a test pattern for detecting a fail memory cell and provide the test pattern to the memory package 40. The address generator 411 may generate an address of memory cells (e.g., a row address of memory cells arranged in a row direction or a column address of memory cells arranged in a column direction) to which the test pattern is to be written, and provide the generated address to the memory package 40. In some embodiments, the test pattern may include a variety of patterns that detect a specific fault and/or a structural defect and have a high fault coverage. The test pattern may include, for example, a random test pattern, a pseudo-random test pattern that is similar to the random test pattern but has repeatability in a test vector sequence, or a parallel bit test pattern including the same data (e.g., '0' or '1'), but is not limited thereto.

The comparator 413 may compare the test pattern written to the memory cells with a pattern read from the same memory cells, and output a comparison result. If the written test pattern and the read pattern are different as a comparison result of the comparator 413, it may be determined that a failure has occurred on the address of the memory cells. In this case, the comparator 413 may output a fail signal that may include fail information.

The redundancy analysis circuit 420 may determine a repair order of the plurality of memory packages 40 based on the fail information and a redundant address count in each memory package 40, and may perform a virtual repair on the plurality of memory packages 40 based on the repair order. The redundant address count in each memory package 40 may indicate the number of redundant addresses remaining in the corresponding memory package 40. A redundant address count may be referred to as a "redundant count". Further, the redundancy analysis circuit 420 may determine a fail address to be repaired in each memory package 40 based on a result obtained by performing the virtual repair. In some embodiments, the redundancy analysis circuit 420 may be a built-in redundancy analysis (BIRA) circuit.

In some embodiments, as shown in FIG. 6, the redundancy analysis circuit 420 may include a redundancy control circuit 421 and a memory 422. The memory 422 may include an area 422a for storing fail information of each memory package and an area 422b for storing a redundant address count of each memory package. In some embodiments, the memory 422 may be implemented as a register. The redundancy control circuit 421 may perform the virtual repair based on the fail information and redundant address count stored in the memory 422, and determine a fail address to be repaired in each memory package 40.

In some embodiments, referring to FIG. 4 again, the memory repair circuit 400 may further include a repair control circuit 430, a command control circuit 440, a selection circuit 450, and a physical layer (PHY) 460.

The repair control circuit 430 may provide the fail information to the redundancy analysis circuit 420 based on the test performed by the test circuit 410. For example, the repair control circuit 430 may provide the fail information received from the test circuit 410 to the redundancy analysis circuit 420. The repair control circuit 430 may determine whether a failure has occurred based on the comparison result of the test pattern and the read pattern provided from the comparator 413 of the test circuit 410. In some embodiments, if, upon testing a certain address of the memory package 40, a predetermined number of fail bits (e.g., fail memory cells) or more are detected at the certain address, the repair control circuit 430 may determine that the certain address is a fail address. The predetermined number may be an integer greater than or equal to one, and may be determined, for example, based on an error correction capability of ECC adapted to a memory module (e.g., 100 in FIG. 1).

The command control circuit 440 may receive a signal from a memory controller (e.g., 2130 in FIG. 21) that controls memory operations. The signal may include a command and an address. The command control circuit 440 may provide the command and the address to the memory package 40 to access the memory package 40 and perform a memory operation such as a read or a write.

The selection circuit 450 may select a signal from either the repair control circuit 430 or the command control circuit 440 and provide the selected signal to the memory package 40. If the selection circuit 450 selects the signal from the repair control circuit 430, the test pattern and the test address transferred from the test circuit 410 may be provided to the memory package 40 via the PHY 460. If the selection circuit 450 selects the signal from the command control circuit 440, the command and the address transferred from the command control circuit 440 may be provided to the memory package 40 via the PHY 460. In some embodiments, the selection circuit may be a multiplexing circuit.

The PHY 460 may transfer the signal from the repair control circuit 430 or the signal from the command control circuit 440 that is transferred by the selection circuit 450 to the memory package 40.

Figure 7:
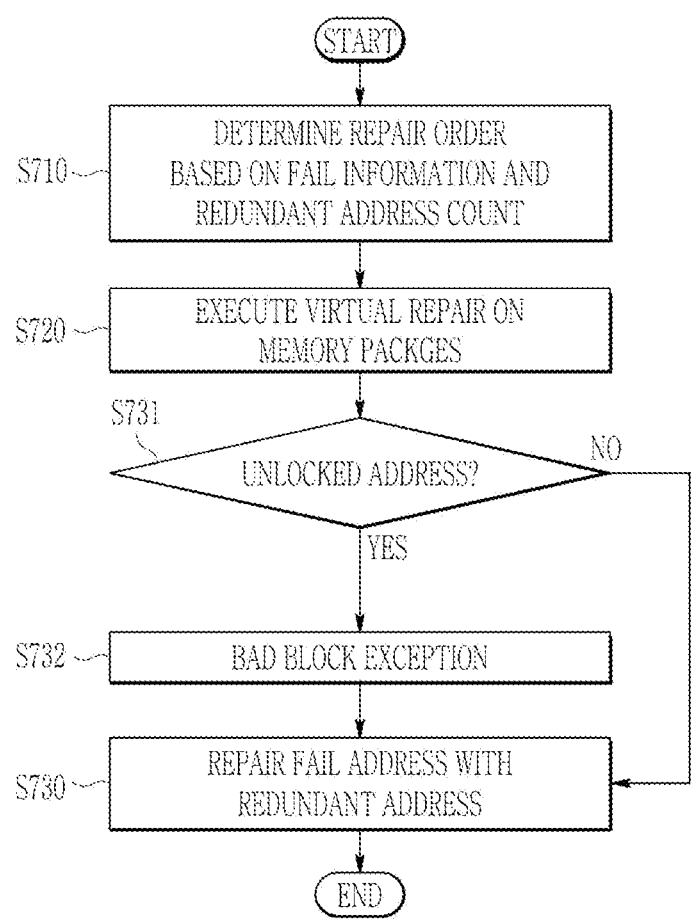
FIG. 7 is a flowchart illustrating an example of an operation method of a memory repair circuit according to some embodiments of the present disclosure.

FIG. 7 is a flowchart illustrating an example of an operation method of a memory repair circuit according to some embodiments of the present disclosure.

Referring to FIG. 7, in S710, a memory repair circuit may obtain fail information of each of a plurality of memory packages and a redundant address count in each of the plurality of memory packages, and determine a repair order of the plurality of memory packages based on the fail information and the redundant address count in each memory package. The fail information of each memory package may include an address (e.g., a fail address) at which a fail bit occurs and a fail bit count in the fail address. In some embodiments, the memory repair circuit may calculate a sum (e.g., a total fail bit count) of the fail bit counts in all fail addresses of each memory package, and determine a descending order of a value obtained by subtracting the total fail bit count from the redundant address count as the repair order of the plurality of memory packages in S710. In some other embodiments, the memory repair circuit may obtain a fail address count in each memory package, and determine a descending order of a value obtained by subtracting the fail address count from the redundant address count as the repair order of the plurality of memory packages in S710.

In some embodiments, the memory repair circuit may obtain a row address having a predetermined number of fail bits or more and/or a column address having the predetermined number of fail bits or more as the fail address. In some embodiments, the memory repair circuit may obtain the fail information of each memory package from a test circuit (e.g., 410 in FIG. 4) and a repair control circuit (e.g., 430 in FIG. 4). In some embodiments, the redundant address count may be the number of redundant addresses remaining after repairs are performed in wafer test and package test stages by using a redundant region. For example, the redundant address count may indicate the number of redundant addresses present in the redundant region of a particular memory package.

The memory repair circuit may determine a fail address to be repaired in each memory package based on the repair order in S720. In some embodiments, the memory repair circuit may determine the fail address to be repaired by virtually performing a repair (hereinafter referred to as a "virtual repair") on the plurality of memory packages in the repair order. In some embodiments, the memory repair circuit may perform the virtual repair by removing a fail bit or a fail address within a range of the redundant address count, and may lock (e.g., set a lock on) a fail address in which the virtual repair does not need to be performed. In some embodiments, the memory repair circuit may lock an address in which the number of fail bits remaining across the plurality of memory packages is less than a threshold. In other words, a fail address may be locked if the number of fail bits remaining across the plurality of memory packages is less than a threshold.

The memory repair circuit may repair the fail address with the redundant address in each memory package based on the result of the virtual repair in S730. The memory repair circuit may repair (e.g., replace) the fail address on which the virtual repair has been performed in each memory package with the redundant address. The memory repair circuit may not repair a fail address that is locked by the virtual repair in each memory package. A fail address that is locked may be referred to as a "locked fail address" or a "locked address". In some embodiments, if a fail address exists that is not locked by virtual repair and has not been removed in S731, the memory repair circuit may determine that the fail address is an unrepairable address and handle it as a bad block exception in S732, and may perform the repair in S730. A fail address that is not locked may be referred to as an "unlocked fail address" or an "unlocked address". On the other hand, if the fail address that is not locked and is not removed by the virtual repair does not exist in S731, the memory repair circuit may perform the repair without handling the bad block exception in S730.

According to the above-described embodiments, the repair may be performed at a memory module (e.g., DIMM) level. Thus, even when a plurality of memory modules are connected to a host device, for example, in a computer express link (CXL) system, the repair may be performed at the memory module level.

Next, a method of determining a repair order in a memory repair circuit is described with reference to FIGS. 8 to 10.

Figure 8:
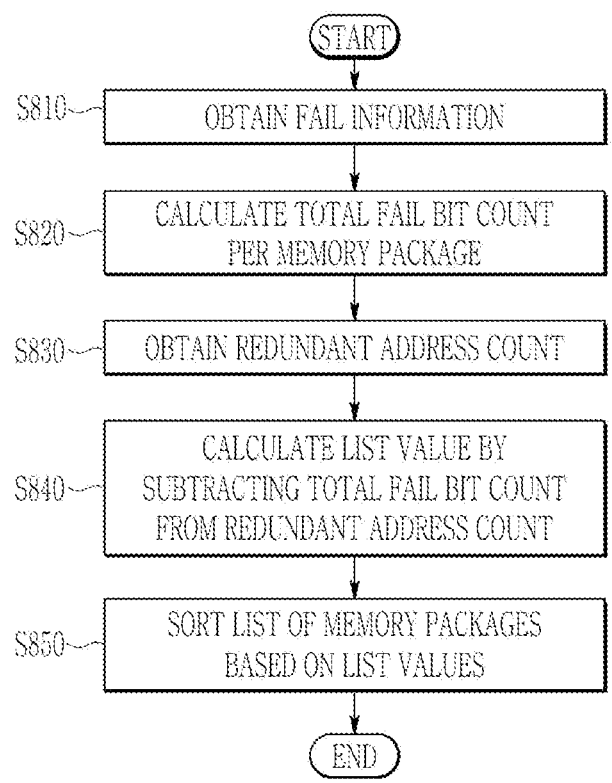
FIG. 8 is a flowchart illustrating an example of a method of determining a repair order in a memory repair circuit according to some embodiments of the present disclosure.

FIG. 8 is a flowchart illustrating an example of a method of determining a repair order in a memory repair circuit according to some embodiments of the present disclosure, FIG. 9 is a diagram illustrating an example of a list generated by a memory repair circuit, and FIG. 10 is a diagram illustrating an example of a list sorted by a memory repair circuit.

Referring to FIG. 8, a memory repair circuit may obtain fail information of each of a plurality memory packages PKGi in S810. When the number of memory packages is, for example, eighteen, i is an integer from 0 to 17. In some embodiments, the memory repair circuit may obtain the fail information of each memory package PKGi from a test circuit (e.g., 410 in FIG. 4) and a repair control circuit (e.g., 430 in FIG. 4) in S810.

The memory repair circuit may calculate the total number of fail bits (e.g., a total fail bit count) in each memory package PKGi in S820. For example, as shown in FIG. 9, fail addresses, a fail bit count in each fail address, and the total fail bit count obtained for each memory package PKGi may be listed in a table. In an example shown in FIG. 9, for convenience, nine memory packages PKG0, PKG1, PKG2, PKG3, PKG4, PKG14, PKG15, PKG16, and PKG17 among the eighteen memory packages are shown, and five addresses ADDR0, ADDR1, ADDR2, ADDR3, and ADDR5 with a predetermined number of fail bits or more are shown. The addresses shown in FIG. 9 may be row addresses and/or column addresses. For example, the memory package PKG0 may have two fail bits in the address ADDR2, one fail bit in the address ADDR3, and one fail bit in the address ADDR5. The memory package PKG1 may have one fail bit in the address ADDR0, three fail bits in the address ADDR1, and one fail bit in the address ADDR3. The memory package PKG2 may have one fail bit in the address ADDR0, one fail bit in the address ADDR3, and three fail bits in the address ADDR5. The memory package PKG3 may have one fail bit in the address ADDR1 and one fail bit in the address ADDR3. The memory package PKG4 may have four fail bits in the address ADDR1 and one fail bit in the address ADDR3. The memory package PKG14 may have one fail bit in the address ADDR0 and one fail bit in the address ADDR3. The memory package PKG15 may have two fail bits in the address ADDR2 and one fail bit in the address ADDR3. The memory package PKG16 may have two fail bits in the address ADDR2 and one fail bit in the address ADDR3. The memory package PKG17 may have one fail bit in the address ADDR0, two fail bits in the address ADDR2, one fail bit in the address ADDR3, and two fail bits in the address ADDR5.

Further, the memory repair circuit may obtain the number of redundant addresses (e.g., a redundant address count) in each memory package PKGi in S830. In some embodiments, the memory repair circuit may obtain the redundant address count from information of a redundant region stored in a register of the memory repair circuit in S830. In some embodiments, the memory repair circuit may log the redundant address count of each memory package PKGi in the table as shown in FIG. 9. For example, the redundant address counts of the memory packages PKG0. PKG2, PKG3, PKG4, and PKG14 may be ten, the redundant address count of the memory package PKG1 may be five, the redundant address count of the memory package PKG15 may be six, the redundant address count of the memory package PKG16 may be four, and the redundant address count of the memory package PKG17 may be two.

Next, the memory repair circuit may calculate the redundant address count minus the total fail bit count in each memory package PKGi in S840. Hereinafter, a value obtained by subtracting the total fail bit count from the redundant address count is referred to as a "list value". The memory repair circuit may sort a list (e.g., table) of memory packages PKGi based on the list values in S850. In some embodiments, the memory repair circuit may sort the list of memory packages PKGi in descending order of the list values. The list of memory packages PKGi may be sorted, for example, as shown in FIG. 10.

For example, in FIG. 10, the memory packages PKGi may be sorted in a descending order of the redundant address count minus the total number of fail bits. For example, the memory package PKG3 may be listed first since its redundant address count minus the total number of fail bits is 8 and the memory package PKG17 may be listed last since its redundant address count minus the total number of fail bits is −4.

Next, a method of performing a virtual repair in a memory repair circuit is described with reference to FIGS. 11 to 15.

Figure 11:
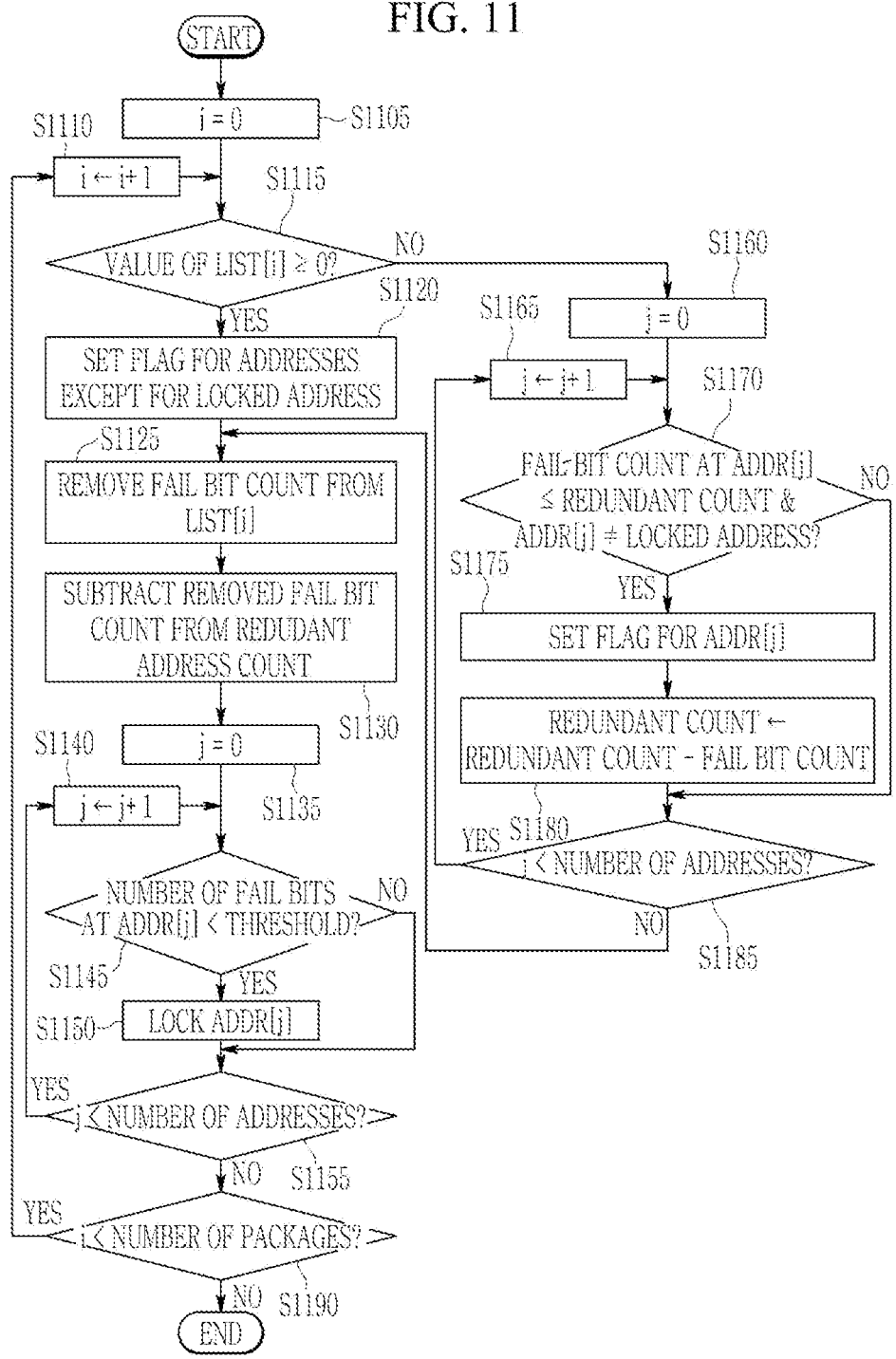
FIG. 11 is a flowchart illustrating an example of a method of performing a virtual repair in a memory repair circuit according to some embodiments of the present disclosure.

FIG. 11 is a flowchart illustrating an example of a method of performing a virtual repair in a memory repair circuit according to some embodiments of the present disclosure, and FIG. 12, FIG. 13, FIG. 14, and FIG. 15 each are a drawing illustrating an example of an address that is locked based on a virtual repair in a memory repair circuit.

Referring to FIG. 11, a memory repair circuit may perform a virtual repair while selecting a memory package in turn from a sorted list. In other words, the memory repair circuit may select the memory package in turn in descending order of list values. In the sorted list, a memory package LIST[i] may correspond to the $i^{th}$ memory package in the sorted list in descending order of the list values. Here, i is an integer between 0 and 17. For example, the first list LIST[0] in the sorted list may be a memory package PKG3 with the largest list value in an example shown in FIG. 10, and the last list LIST[17] may be a memory package PKG17 with the smallest list value in the example shown in FIG. 10.

The memory repair circuit may first select the list LIST[0] from the sorted list, and then may select a next list in turn in S1105 and S1110.

If a target list LIST[i], e.g., a memory package of the target list (hereinafter referred to as a "target memory package") LIST[i] is selected from the sorted list, the memory repair circuit may determine whether a list value of the target memory package LIST[i] is greater than or equal to zero in S1115. In other words, in S1115, the memory repair circuit may determine whether there is a redundant address remaining after subtracting a total fail bit count from a redundant address count, in order to perform a virtual repair within a range of the redundant address count.

If the list value is greater than or equal to zero, the memory repair circuit may virtually repair a fail address of the target memory package LIST[i] based on the redundant address of the target memory package LIST[i]. In some embodiments, the memory repair circuit may perform the virtual repair by removing the fail bit count in a fail address except for a locked fail address, within the range of the redundant address count of the target memory package LIST[i]. In this case, since the list value is greater than or equal to zero, the whole fail bit count of the fail address except for the locked fail address may be removed. Thus, the memory repair circuit may update the fail bit count of the fail address by removing the fail bit count in the fail address except for the locked fail address in the target memory package LIST[i] in S1125. For example, in S1125, the memory repair circuit may update the fail bit count to zero in the fail address except for the locked fail address. Further, the memory repair circuit may update the redundant address count of the target memory package LIST[i] to a value obtained by subtracting the removed fail bit count from the redundant address count in S1130.

In some embodiments, after removing the fail bit count (e.g., updating the fail bit count) in the target memory package PKG[i], the memory repair circuit may determine whether to lock each address in S1145 and S1150. In some embodiments, the memory repair circuit may select the address ADDR[0] and then select a next address in turn in S1135 and S1140. The memory repair circuit may calculate a sum (e.g., total errors) of the fail bit counts in all the memory packages (e.g., all the lists) at the address ADDR[j], and compare the sum of the fail bit counts with a threshold in S1145. If the sum of the fail bit counts at a certain address ADDR[j] is less than the threshold, the memory repair circuit may lock the certain address ADDR[j] in S1150. The memory repair circuit may perform the operations of S1145 and S1150 or the operation of S1145 for all the addresses in S1155. The memory repair circuit may not perform the virtual repair on the locked address. In some embodiments, the threshold may be determined based on an error correction capability of ECC applied to a memory module. Even if a fail bit is present in an address, if the fail bit is covered by the error correction capability of the ECC, the errors may be corrected without needing to repair the address.

For handling of locked addresses, if the list value of the target memory package LIST[i] is greater than or equal to zero in S1115, the memory repair circuit may set a flag to an address except for the locked address in the target memory package LIST[i] in S1120. For example, the memory repair circuit may set the flag of the address other than the locked address in the target memory package LIST[i] to a predetermined value (e.g., '1'). The flag may indicate that the address is targeted for the virtual repair (S1125). Thus, in S1125, the memory repair circuit may remove the fail bit count in the address whose flag is set, and may not remove the fail bit count in the address whose flag is not set.

In some embodiments, if the list value of the $i^{th}$ memory package PKGi is less than zero in S1115, the memory repair circuit may perform the virtual repair on some addresses within the range of the redundant address count in S1170 and S1175. The memory repair circuit may select an address ADDR[0], and then select a next address in turn in S1160 and S1165. If the fail bit count in the selected address ADDR[j] is less than or equal to the redundant address count, and the selected address ADDR[j] is not locked in S1170, the memory repair circuit may set a flag to the selected address ADDR[j] in S1175. Next, the memory repair circuit may update the redundant address count to a value obtained by subtracting the fail bit count at the address ADDR[j] from the redundant address count in S1180, and perform the operation of S1170 for the next address. On the other hand, if the fail bit count at the selected address ADDR[j] is greater than the redundant address count, or if the selected address ADDR[j] is locked in S1170, the memory repair circuit may not set the flag to the selected address ADDR[j]. The memory repair circuit may perform the operations of S1170 to S1180 or the operation of S1170 for all addresses in S1185. Next, the memory repair circuit may perform the virtual repair on the address that is not locked in S1125.

In this way, the memory repair circuit may perform the virtual repair on each memory package (e.g., list) and lock the addresses that do not need to be repaired, and may perform the above-described operations for all memory packages in S1190.

In the example shown in FIG. 10 and FIG. 12, after the virtual repair is performed on the memory packages PKG3 and PKG14, the sum of the fail bit counts at the address ADDR0 is three, since the fail bit count of the memory package PKG14 at the address ADDR0 is removed. If the threshold is four (see FIG. 10), the address ADDR0 may be locked as shown in FIG. 12, since the sum of the fail bit counts at the address ADDR0 is three. Although there are the fail bits in the address ADDR0, the fail bits may be corrected by the ECC, such that no virtual repairs may be performed on the address ADDR0 in subsequent virtual repairs of memory packages PKG0, PKG2, PKG4, PKG15, PKG16, PKG1, and PKG17. After the virtual repair of the memory packages PKG0, PKG2, and PKG4 is performed, the sum of the fail bit counts at the address ADDR1 may be three, and the sum of the fail bit counts at the address ADDR2 may be two. Therefore, as shown in FIG. 13, after the virtual repair of the memory package PKG4 is performed, the addresses ADDR1 and ADDR5 may be locked since the four fail bit counts at the address ADDR1 were further removed and no virtual repairs may be performed on the addresses ADDR1 and ADDR5 in the subsequent virtual repair of the memory packages PKG15, PKG16, PKG1, and PKG17. After the virtual repair of the memory package PKG15 is performed, the sum of the fail bit counts in the address ADDR3 may be three. Therefore, as shown in FIG. 14, after the virtual repair of memory package PKG15 is performed, the address ADDR3 may be locked and no virtual repairs may be performed on the address ADDR3 in subsequent virtual repairs of memory packages PKG16, PKG1, and PKG17. After the virtual repair of the memory package PKG16 is performed, the sum of the fail bit counts in the address ADDR2 may be two. Therefore, as shown in FIG. 15, after the virtual repair of the memory package PKG16 is performed, the address ADDR2 may be locked and no virtual repairs may be performed on the address ADDR2 in the subsequent virtual repair of the memory packages PKG1 and PKG17.

Based on the result of the virtual repair performed in this manner, the memory repair circuit may execute a repair (e.g., real repair). In some embodiments, the memory repair circuit may repair a fail address removed by the virtual repair in each memory package with a redundant address. For example, as shown in FIG. 15, the addresses ADDR2, ADDR3, and ADDR5 may be repaired in the memory package PKG0, no repairs may be performed in the memory packages PKG1 and PKG17, the addresses ADDR3 and ADDR5 may be repaired in the memory package PKG2, the addresses ADDR1 and ADDR3 may be repaired in the memory packages PKG3, PKG4, and PKG14, the addresses ADDR2 and ADDR3 may be repaired in the memory package PKG15, and the address ADDR2 may be repaired in the memory package PKG16.

As described above, the memory repair circuit may perform the repair on the fail addresses determined by the virtual repair, and may not perform the repair on some fail addresses (e.g., ADDD0, ADDR1, and ADDR3 in PKG1, ADDD0 in PKG2, ADD3 in PKG16, ADDR0, ADDR2, ADDR3, and ADDR5 in PKG17). Even if some fail addresses are not repaired, errors caused by some fail addresses may be corrected because they are within the error correction capability of the ECC applied to the memory module. Thus, the redundant addresses may not be wasted based on the error correction capability of the ECC.

Figure 16:
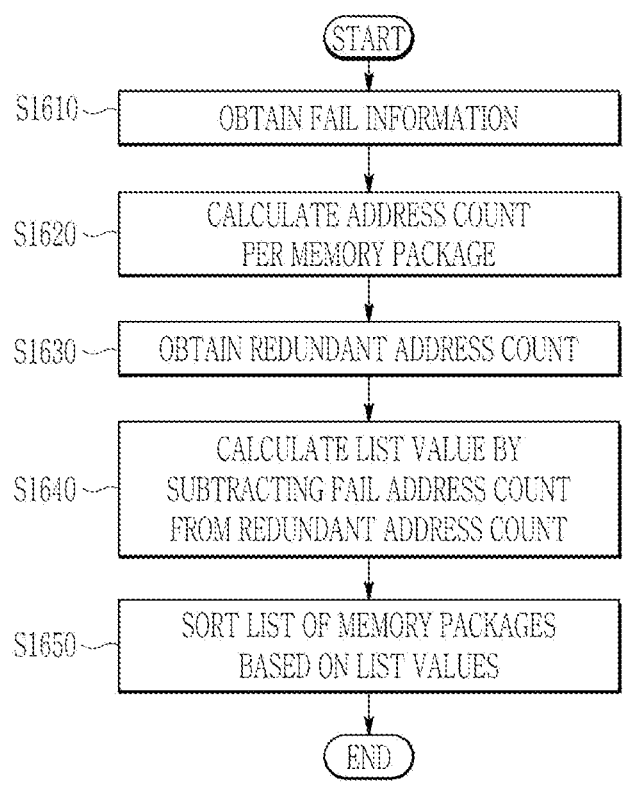
FIG. 16 is a flowchart illustrating an example of a method of determining a repair order in a memory repair circuit according to some embodiments of the present disclosure.

FIG. 16 is a flowchart illustrating an example of a method of determining a repair order in a memory repair circuit according to some embodiments of the present disclosure, FIG. 17 is a diagram illustrating an example of a list generated by a memory repair circuit, and FIG. 18 is a diagram illustrating an example of a list sorted by a memory repair circuit.

Referring to FIG. 16, a memory repair circuit may obtain fail information of each of a plurality of memory packages PKGi in S1610. The memory repair circuit may calculate the number of fail addresses (e.g., a fail address count) in each memory package PKGi in S1620. For example, as shown in FIG. 16, fail addresses, a fail bit count in each fail address, and the fail address count obtained for each memory package PKGi may be listed in a table. Since an example shown in FIG. 17 has the same fail pattern as the example shown in FIG. 9, its detail description is omitted. Referring to FIG. 17, the fail address counts of the memory packages PKG0, PKG1, and PKG2 may be three, the fail address counts of the memory packages PKG3, PKG4, PKG14, PKG15, and PKG16 may be two, and the fail address count of the memory package PKG17 may be four. Further, the memory repair circuit may obtain a redundant address count in each memory package PKGi in S1630.

Next, the memory repair circuit may subtract the fail address count from the redundant address count in each memory package PKGi in S1640. Hereinafter, a value of obtained by subtracting the fail address count from the redundant address count is referred to as a "list value". The memory repair circuit may sort a list (e.g., table) of memory packages PKGi based on the list values in S1650. In some embodiments, the memory repair circuit may sort the list of memory packages PKGi in descending order of the list values. The list of memory packages PKGi may be sorted, for example, as shown in FIG. 18. For example, the memory package PKG3 having the list value of 8 may be first in order and the memory package PKG17 having the list value of −2 may be last in order.

Figure 19:
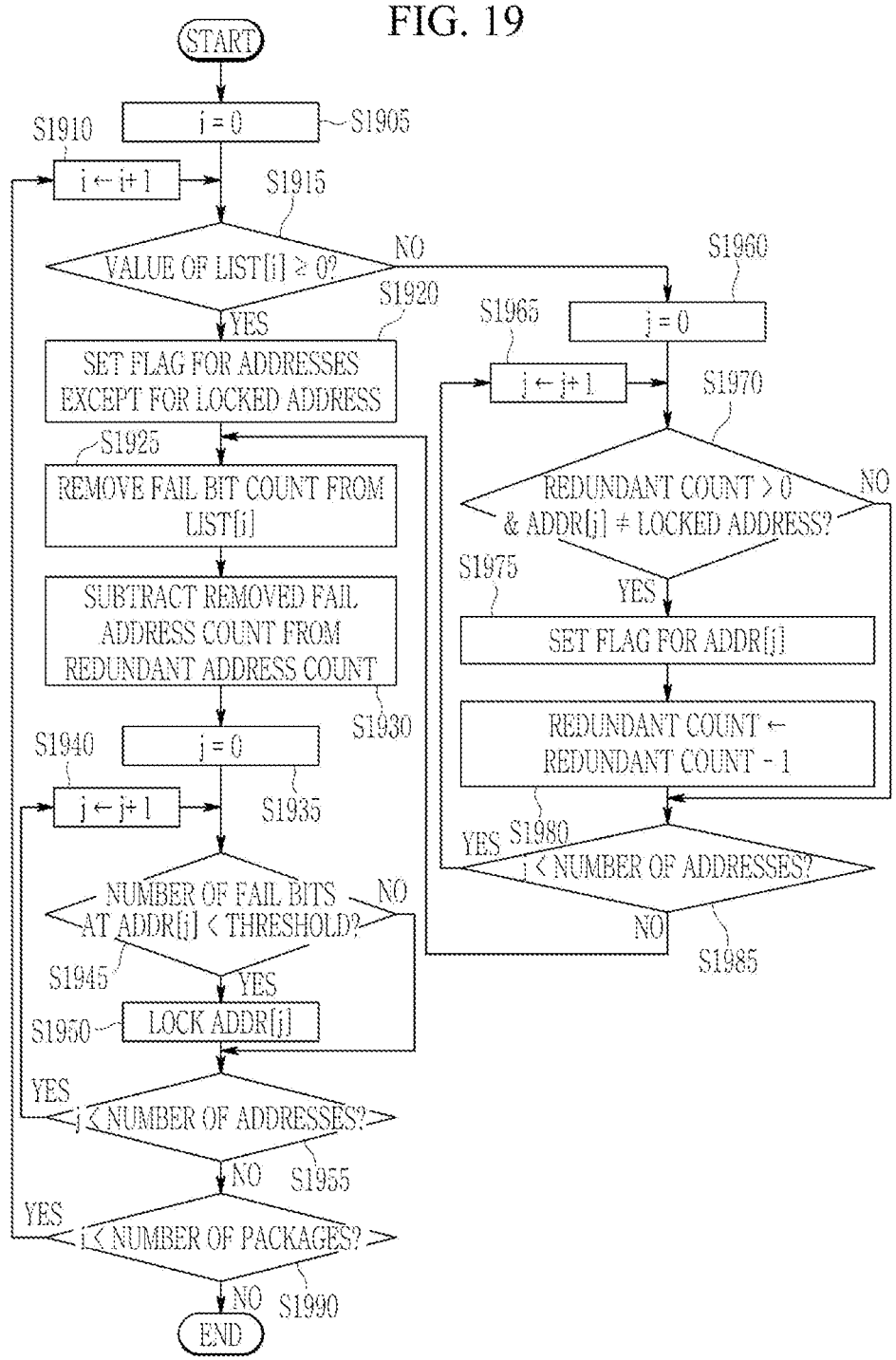
FIG. 19 is a flowchart illustrating an example of a method of performing a virtual repair in a memory repair circuit according to some embodiments of the present disclosure.

FIG. 19 is a flowchart illustrating an example of a method of performing a virtual repair in a memory repair circuit according to some embodiments of the present disclosure, and FIG. 20 is a diagram illustrating an example of an address that is locked based on a virtual repair in a memory repair circuit.

Referring to FIG. 19, a memory repair circuit may perform a virtual repair while selecting a memory package in turn from the sorted list. In other words, the memory repair circuit may select the memory package in turn in descending order of list values. The memory repair circuit may first select a list LIST[0] from the sorted list, and then select a next list in turn in S1905 and S1910.

When selecting the $i^{th}$ list LIST[i], e.g., a target memory package of the $i^{th}$ list LIST[i] from the sorted list, the memory repair circuit may determine whether the list value of the target memory package LIST[i] is greater than or equal to zero in S1915. If the list value is greater than or equal to zero, the memory repair circuit may virtually repair a fail address of the target memory package LIST[i] based on a redundant address of the target memory package LIST[i]. In some embodiments, the memory repair circuit may perform the virtual repair by removing the fail address except for a locked address, within a range of a redundant address count of the target memory package LIST[i]. In this case, since the list value is greater than or equal to zero, all fail addresses except for the locked address may be removed within the range of the redundant address count. Thus, the memory repair circuit may update the fail bit count of the fail address by removing the fail bit count in the fail address except for the locked address in S1925. For example, in S1925, the memory repair circuit may update the fail bit count to zero in the fail address except for the locked address. Further, the memory repair circuit may update the redundant address count of the target memory package LIST[i] to a value obtained by subtracting, from the redundant address count, the number of fail addresses in which the fail bit count has been removed in S1930.

In some embodiments, after removing the fail bit count, the memory repair circuit may determine whether to lock each address in S1945 and S1950. In some embodiments, the memory repair circuit may select an address ADDR[0], and then select a next address in turn in S1935 and S1940. The memory repair circuit may calculate a sum (e.g., total errors) of the fail bit counts in all the memory packages (e.g., all the lists) at each address ADDR[j], and compare the sum of the fail bit counts with a threshold in S1945. If the sum of the fail bit counts at a certain address ADDR[j] is less than the threshold, the memory repair circuit may lock the certain address ADDR[j] in S1950. The memory repair circuit may perform the operations of S1945 and S1950 or the operation of S1945 for all addresses in S1955.

For handling of locked addresses, if the list value of the target memory package LIST[i] is greater than or equal to zero in S1915, the memory repair circuit may set a flag to an address in the target memory package LIST[i] except for the locked address in S1920. Thus, in S1925, the memory repair circuit may remove the fail bit count in the address whose flag is set, and may not remove the fail bit count in the address whose flag is not set.

In some embodiments, if the list value of the target memory package PKGi is less than zero in S1915, the memory repair circuit may perform the virtual repair on some addresses within the range of the redundant address count in S1970 and S1975. The memory repair circuit may select an address ADDR[0], and then select a next address in turn in S1960 and S1965. If the redundant address count is greater than zero and the selected address ADDR[j] is not locked in S1970, the memory repair circuit may set a flag on the selected address ADDR[j] in S1975. Next, the memory repair circuit may decrement the redundant address count by one in S1980, and perform the operation of S1970 for the next address. On the other hand, if the redundant address count is zero or less, or if the selected address ADDR[j] is locked in S1970, the memory repair circuit may not set the flag to the selected address ADDR[j]. The memory repair circuit may perform the operations of S1970 to S1980 or the operation of S1970 for all addresses in S1985. Next, the memory repair circuit may perform the virtual repair on the addresses that is not locked in S1925.

In this way, the memory repair circuit may perform the virtual repair on each memory package (e.g., list) and lock the addresses that do not need to be repaired, and may perform the above-described operations for all memory packages in S1990.

In the example shown in FIG. 18, after the virtual repair is performed on the memory packages PKG3 and PKG4, the sum of the fail bit counts at the address ADDR1 may be three. For example, the memory package PKG1 may have three fail bit counts at the address ADDR1. If the threshold is four, the address ADDR1 may be locked as shown in FIG. 20. After the virtual repair of the memory package PKG14 is performed, the sum of the fail bit counts at the address ADDR0 may be three, so the address ADDR0 may be locked as shown in FIG. 20. After the virtual repair of the memory packages PKG0 and PKG2 is performed, the sum of the fail bit counts at the address ADDR5 may be two, so the address ADDR5 may be locked as shown in FIG. 20. After the virtual repair of the memory package PKG15 is performed, the sum of the fail bit counts at the address ADDR3 may be three, so the address ADDR3 may be locked as shown in FIG. 20. After the virtual repair of the memory packages PKG1 and PKG16 is performed, the sum of the fail bit counts at the address ADDR2 may be two, so the address ADDR2 may be locked as shown in FIG. 20.

Based on the result of the virtual repair performed in this manner, the memory repair circuit may execute a repair (e.g., real repair). In some embodiments, the memory repair circuit may repair the fail address removed by the virtual repair in each memory package with a redundant address. For example, as shown in FIG. 20, the addresses ADDR2, ADDR3, and ADDR5 may be repaired in the memory package PKG0, no repairs may be performed in the memory packages PKG1 and PKG17, the addresses ADDR3 and ADDR5 may be repaired in the memory package PKG2, the addresses ADDR1 and ADDR3 may be repaired in the memory packages PKG3, PKG4, and PKG14, the addresses ADDR2 and ADDR3 may be repaired in the memory package PKG15, and the address ADDR2 may be repaired in the memory package PKG16.

As described above, the memory repair circuit may perform the repairs on the fail addresses determined by the virtual repair, and may not perform the repair on some fail addresses (e.g., ADDD0, ADDR1, and ADDR3 in PKG1, ADDD0 in PKG2, ADD3 in PKG16, ADDR0, ADDR2, ADDR3, and ADDR5 in PKG17). Even if some fail addresses are not repaired, errors caused by some fail addresses may be corrected because they are within an error correction capability of ECC applied to a memory module. Thus, the redundant addresses may not be wasted based on the error correction capability of the ECC.

Figure 21:
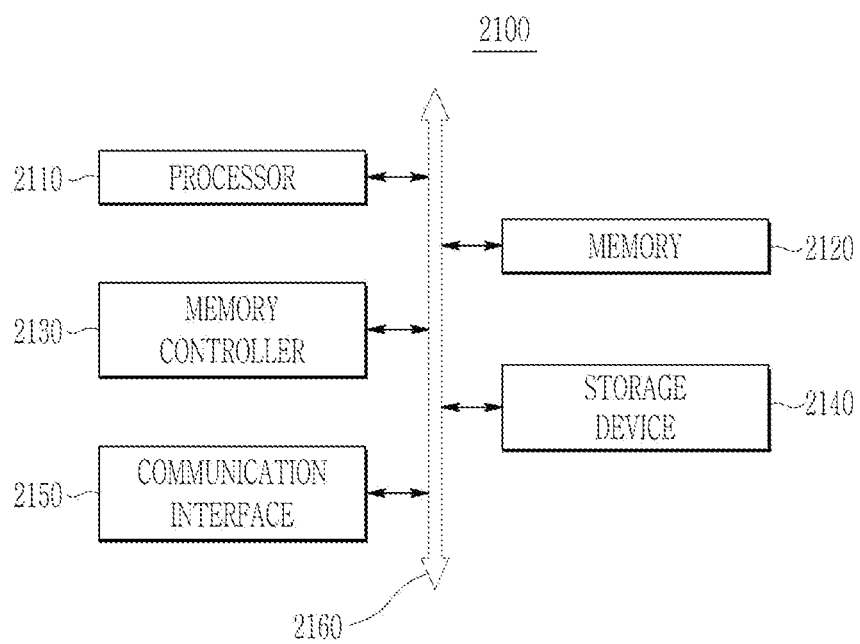
FIG. 21 is a block diagram illustrating an example of a computing device according to some embodiments of the present disclosure.

FIG. 21 is a block diagram illustrating an example of a computing device according to some embodiments of the present disclosure.

Referring to FIG. 21, a computing device 2100 may include a processor 2110, a memory 2120, a memory controller 2130, a storage device 2140, a communication interface 2150, and a bus 2160. The computing device 2100 may further include other general-purpose components.

The processor 2110 may control an overall operation of each component of the computing device 2100. The processor 2110 may be implemented as at least one of various processing units such as a central processing unit (CPU), an application processor (AP), and a graphic processing unit (GPU).

The memory 2120 may store various data and instructions. The memory controller 2130 may control transfers of data or commands to and from the memory 2120. In some embodiments, the memory controller 2130 may be provided as a separate chip from the processor 2110. In some embodiments, the memory controller 2130 may be provided as an internal component of the processor 2110. The memory 2120 may be implemented as a memory device described with reference to FIGS. 1 to 20.

The storage device 2140 may non-transitively store a program and data. In some embodiments, the storage device 2140 may be implemented as a non-volatile memory. The communication interface 2150 may support wired or wireless internet communication of the computing device 2100. Further, the communication interface 2150 may support various communication methods other than internet communication. The bus 2160 may provide a communication function between the components of the computing device 2100. The bus 2160 may include at least one type of bus depending on a communication protocol between the components of the computing device 2100.

While this invention has been described in connection with example embodiments, it is to be understood that the invention is not limited to the disclosed embodiments. For example, the invention can cover various modifications and equivalent arrangements included within the scope of the appended claims.

What is claimed is:

1. A memory repair circuit of a memory module including a plurality of memory packages, the memory repair circuit comprising:
    a test circuit configured to test the plurality of memory packages to obtain fail information in each of the plurality of memory packages; and
    a redundancy analysis circuit configured to:
        obtain a redundant address count in each of the plurality of memory packages,
        determine a repair order of the plurality of memory packages based on the fail information and the redundant address count, the fail information including a first fail address in each of the plurality of memory packages and a fail bit count in the first fail address; and
        perform a virtual repair on the plurality of memory packages in the repair order and determine a second fail address to be repaired in each of the plurality of memory packages.

2. The memory repair circuit of claim 1, wherein the redundancy analysis circuit is further configured to perform the virtual repair by removing a fail bit or the first fail address within a range of the redundant address count.

3. The memory repair circuit of claim 2, wherein the second fail address has a predetermined number of fail bits or more.

4. The memory repair circuit of claim 2, wherein the redundancy analysis circuit is further configured to determine the repair order based on a value obtained by subtracting a sum of the fail bit count in each of the plurality of memory packages from the redundant address count in each of the plurality of memory packages.

5. The memory repair circuit of claim 4, wherein the redundancy analysis circuit is further configured to determine the repair order as a descending order of the value.

6. The memory repair circuit of claim 2, wherein the redundancy analysis circuit is further configured to determine the repair order based on a value obtained by subtracting a fail address count of each of the plurality of memory packages from the redundant address count of each of the plurality of memory packages.

7. The memory repair circuit of claim 6, wherein the redundancy analysis circuit is further configured to determine the repair order as a descending order of the value.

8. The memory repair circuit of claim 2, wherein the redundancy analysis circuit is further configured to:
    select a target memory package from among the plurality of memory packages based on the repair order;
    perform the virtual repair on the target memory package; and
    lock the first fail address when a number of fail bits remaining across the plurality of memory packages is less than a threshold.

9. The memory repair circuit of claim 8, wherein the redundancy analysis circuit is further configured to perform the virtual repair on the target memory package by removing a fail bit of an unlocked fail address in the target memory package, within a range of the redundant address count of the target memory package, and
    wherein the unlocked fail address is the first fail address that is not locked when the number of fail bits remaining across the plurality of memory packages is greater than or equal to the threshold.

10. The memory repair circuit of claim 9, wherein the redundancy analysis circuit is further configured to update the fail bit count of the target memory package by removing the fail bit of the fail address on which the virtual repair is performed.

11. The memory repair circuit of claim 8, wherein the redundancy analysis circuit is further configured to perform the virtual repair by removing an unlocked fail address in the fail address of the target memory package within a range of the redundant address count of the target memory package.

12. The memory repair circuit of claim 11, wherein the redundancy analysis circuit is further configured to update the fail bit count by removing a fail bit of the fail address on which the virtual repair is performed.

13. The memory repair circuit of claim 8, wherein the threshold is determined based on an error correction code (ECC) applied to the memory module.

14. A memory device comprising:
    a plurality of memory packages; and
    a controller configured to:
        determine a repair order of the plurality of memory packages based on fail information in each of the plurality of memory packages and a redundant address count in each of the plurality of memory packages, the fail information including a first fail address and a fail bit count in the first fail address; and
        determine a second fail address to be repaired in each of the plurality of memory packages in the repair order.

15. The memory device of claim 14,
    wherein the controller is further configured to determine the repair order as a descending order of a value obtained by subtracting a sum of the fail bit count in each of the plurality of memory packages from the redundant address count in each of the plurality of memory packages.

16. The memory device of claim 15, wherein the controller is further configured to:
    select a target memory package from among the plurality of memory packages based on the repair order;
    remove a fail bit of an unlocked fail address among the first fail address of the target memory package within a range of the redundant address count of the target memory package; and
    lock the first fail address when a sum of the fail bit count across the plurality of memory packages is less than a threshold.

17. The memory device of claim 15,
    wherein the controller is further configured to determining the repair order as a descending order of a value obtained by subtracting the fail address count in each of the plurality of memory packages from the redundant address count in each of the plurality of memory packages.

18. The memory device of claim 17, wherein the controller is further configured to:
   select a target memory package from among the plurality of memory packages based on the repair order;
   remove an unlocked fail address among the first fail address of the target memory package within a range of the redundant address count of the target memory package; and
   lock the first fail address when a sum of the fail bit count across the plurality of memory packages is less than a threshold.

19. A method of repairing a memory module including a plurality of memory packages, the method comprising:
   obtaining fail information in each of the plurality of memory packages;
   obtaining a redundant address count in each of the plurality of memory packages;
   determining a repair order of the plurality of memory packages based on the fail information and the redundant address count; and
   determining an address to be repaired in each of the plurality of memory packages in the repair order.

20. The method of claim 19, wherein the determining the repair order comprises determining the repair order as a descending order of a value obtained by subtracting a value based on the fail information in each of the plurality of memory packages from the redundant address count in each of the plurality of memory packages.

* * * * *